US 9,147,909 B2

(12) United States Patent  
Sim

(10) Patent No.: US 9,147,909 B2  
(45) Date of Patent: Sep. 29, 2015

(54) BATTERY MANAGEMENT SYSTEM AND METHOD FOR SYNCHRONIZING VOLTAGE AND CURRENT OF BATTERY

(75) Inventor: Se-Sub Sim, Yongin-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 594 days.

(21) Appl. No.: 13/540,573

(22) Filed: Jul. 2, 2012

(65) Prior Publication Data

US 2013/0046495 A1     Feb. 21, 2013

Related U.S. Application Data

(60) Provisional application No. 61/525,576, filed on Aug. 19, 2011.

(51) Int. Cl.
*G01R 31/00* (2006.01)
*H01M 10/42* (2006.01)
*H01M 10/48* (2006.01)
*G01R 31/36* (2006.01)

(52) U.S. Cl.
CPC ......... *H01M 10/425* (2013.01); *G01R 31/3658* (2013.01); *H01M 10/48* (2013.01); *H01M 10/482* (2013.01); *G01R 31/3624* (2013.01); *H01M 10/488* (2013.01); *H01M 2010/4278* (2013.01)

(58) Field of Classification Search
CPC .............. G01R 31/3624; G01R 31/36; H01M 8/04298
USPC ................ 324/433; 320/133, 155; 702/53, 64
See application file for complete search history.

(56) References Cited

U.S. PATENT DOCUMENTS

| 7,075,269 B2 | 7/2006 | Takaoka et al. |
| 2006/0291503 A1* | 12/2006 | Chapman ...................... 370/469 |
| 2010/0013442 A1 | 1/2010 | Yamazaki et al. |

(Continued)

FOREIGN PATENT DOCUMENTS

| JP | 2005-245095 A | 9/2005 |
| JP | 2008-61343 A | 3/2008 |

(Continued)

OTHER PUBLICATIONS

Office action for Korean Patent Application No. 10-2012-0090233 issued on Oct. 7, 2013, pp. 1-5.

*Primary Examiner* — John Breene
*Assistant Examiner* — Mohammad K Islam
(74) *Attorney, Agent, or Firm* — Christie, Parker & Hale, LLP

(57) ABSTRACT

A controller of a power storage system includes a voltage measuring device configured to be electrically coupled to at least one cell and to generate first voltage data, the first voltage data comprising a first voltage value and a first voltage measurement time of a voltage of the at least one cell, and a current measuring device configured to be electrically coupled to the at least one cell and to generate first current data, the first current data comprising a first current value and a first current measurement time of a current through the at least one cell, the first voltage measurement time corresponding to the first current measurement time in a first measuring period, a battery management system configured to generate a clock signal transmitted to the voltage measuring device and the current measuring device to synchronize the first voltage data and the first current data in a first transmission period of the first measuring period.

15 Claims, 7 Drawing Sheets

(56) References Cited

U.S. PATENT DOCUMENTS

2010/0171503 A1* 7/2010 Fredette ............... 324/428
2011/0204898 A1* 8/2011 Kim et al. ............. 324/434
2012/0032638 A1 2/2012 Jung

FOREIGN PATENT DOCUMENTS

| KR | 10-2007-0095612 A | 10/2007 |
| KR | 10-2010-0052417 | 5/2010 |
| KR | 10-1000550 B1 | 12/2010 |

* cited by examiner

BATTERY MANAGEMENT SYSTEM AND METHOD FOR SYNCHRONIZING VOLTAGE AND CURRENT OF BATTERY

CROSS-REFERENCE TO RELATED APPLICATIONS

This application claims priority to and the benefit of U.S. Provisional application No. 61/525,576, filed Aug. 19, 2011.

BACKGROUND (a) Field

Aspects of embodiments of the present invention relate to a battery management system.

(b) Description of the Related Art

In a power storage system, the battery may be iteratively charged and discharged during a short period of time. In order to calculate an accurate state of charge SOC (e.g., relative state of charge (RSOC)) in an environment in which charging and discharging are iteratively performed during a short period of time, a cell voltage and a current amount should be continuously measured with a short measuring period. A measured voltage and a measured current respectively measured by a voltage sensor and a current sensor are transmitted to a processor that calculates the SOC. The measured voltage and the measured current may experience a transmission delay or a transmission error during a transmission process, and, accordingly, the measured voltage and the measured current might not be easily synchronized.

SUMMARY

Aspects of embodiments of the present invention provide a controller of a power storage system (e.g., a battery management device) that matches synchronization of a measured voltage and a measured current of a plurality of cells (e.g., battery cells) and a method for synchronization of a voltage and a current of a battery.

A controller of a power storage system according to an exemplary embodiment of the present invention includes a voltage measuring device configured to be electrically coupled to at least one cell and to generate first voltage data, the first voltage data including a first voltage value and a first voltage measurement time of a voltage of the at least one cell, and a current measuring device configured to be electrically coupled to the at least one cell and to generate first current data, the first current data including a first current value and a first current measurement time of a current through the at least one cell, the first voltage measurement time corresponding to the first current measurement time in a first measuring period, a battery management system configured to generate a clock signal transmitted to the voltage measuring device and the current measuring device to synchronize the first voltage data and the first current data in a first transmission period of the first measuring period.

The voltage measuring device may be configured to transmit the first voltage data in a number of first voltage data transmission periods corresponding to a number of cells of the at least one cell during the first transmission period in the first measuring period, each of the first voltage data transmission periods corresponding to the first voltage measurement time of the first voltage data, and the current measuring device may be configured to transmit the first current data in a first current data transmission period during the first transmission period in the first measuring period, the first current data transmission period corresponding to the first current measurement time of the first current data.

The first measuring period may further include a first processing period for calculating a first state of charge using the first voltage data and the first current data.

The voltage measuring device may be further configured to generate second voltage data including a second voltage value and a second voltage measurement time of the voltage of the at least one cell during a second measuring period, wherein the current measuring device may be further configured to generate second current data including a second current value and a second current measurement time of the current through the at least one cell during the second measuring period, and wherein the controller may be configured to calculate a second SOC using the second current data, the first voltage data corresponding to one or more cells of the at least one cell, and the second voltage data corresponding to other cells of the at least one cell, when the second voltage data corresponding to the one or more cells of the at least one cell is erroneous.

The controller may further include a display device configured to display an error message when the second voltage data is erroneous.

The controller may be configured to send a retransmission request to the voltage measuring device when the second voltage data is repeatedly erroneous.

The controller may be further configured to re-calculate the second SOC using the second current data, third voltage data corresponding to the one or more cells of the at least one cell generated during a third measuring period following the second measuring period, and the second voltage data corresponding to the other cells of the at least one cell, when the second voltage data corresponding to the one or more cells of the at least one cell is erroneous.

The voltage measuring device may be further configured to generate second voltage data including a second voltage value and a second voltage measurement time of the voltage of the at least one cell during a second measuring period, wherein the current measuring device may be further configured to generate second current data including a second current value and a second current measurement time of the current through the at least one cell during the second measuring period, and wherein the controller may be configured to calculate a second SOC using the first current data and the first voltage data corresponding to the at least one cell, when the second voltage data corresponding to one or more cells of the at least one cell is erroneous.

The controller may further include a display device configured to display an error message when the second voltage data is erroneous.

The controller may be configured to send a retransmission request to the voltage measuring device.

The controller may be further configured to re-calculate the second SOC using the second current data, third voltage data corresponding to the one or more cells of the at least one cell generated during a third measuring period following the second measuring period, and the second voltage data corresponding to other cells of the at least one cell.

A power storage apparatus according to another exemplary embodiment of the present invention includes a battery rack, the battery rack including a rack controller configured to generate a clock signal to synchronize voltage data and current data of at least one cell, a current measuring device configured to measure a current through the at least one cell to determine a current value of the current data, a plurality of battery trays, each of the battery trays including a voltage measuring device configured to be electrically coupled to one or more cells on a corresponding one of the battery trays from among cells of the at least one cell, a tray controller configured to be managed by the rack controller, and configured to receive the voltage data from the voltage measuring device, the voltage data including at least one of a voltage value, a temperature value, or a measurement time of the one or more cells on the corresponding one of the battery trays, and transmit the voltage data to the rack controller, wherein the rack controller is configured to synchronize the voltage data with the current data, and calculate a rack state of charge using the voltage data and the current data.

Another embodiment of the present invention provides a method of operating a controller configured to calculate a state of charge using voltage data and current data of at least one cell, wherein, when the voltage data of one or more cells of the at least one cell is erroneous in a present measuring period, the method includes calculating a present state of charge using most recently correct voltage data of the one or more cells of the at least one cell, and using either correct present measuring period voltage data of other cells of the at least one cell and correct present measuring period current data, or correct previous measuring period voltage data of the other cells of the at least one cell and correct previous measuring period current data.

When the voltage data of the one or more cells of the at least one cell is erroneous in a present measuring period, the method may further include displaying an error message, transmitting a retransmission request to request subsequent measuring period voltage data of the one or more cells of the at least one cell have priority over subsequent voltage data of the other cells of the at least one cell in a subsequent measuring period, and transmitting the subsequent voltage data of the one or more cells of the at least one cell in the subsequent measuring period with priority over the subsequent voltage data of the other cells of the at least one cell.

When subsequent voltage data of the one or more cells of the at least one cell is correctly transmitted, the method may further include calculating a first subsequent state of charge in a subsequent measuring period using the present measuring period voltage data of the other cells of the at least one cell and subsequent measuring period voltage data of the one or more cells of the at least one cell during a reprocessing period (e.g., reprocessing section) in the subsequent measuring period, and calculating a second subsequent state of charge in the subsequent measuring period using the subsequent measuring period voltage data of the other cells of the at least one cell and the subsequent measuring period voltage data of the one or more cells of the at least one cell during a processing period in the subsequent measuring period following the reprocessing period.

According to embodiments of the present invention, a measured voltage and a measured current of a plurality of cells may be synchronized, and an accurate SOC can be calculated.

DETAILED DESCRIPTION

Figure 1:
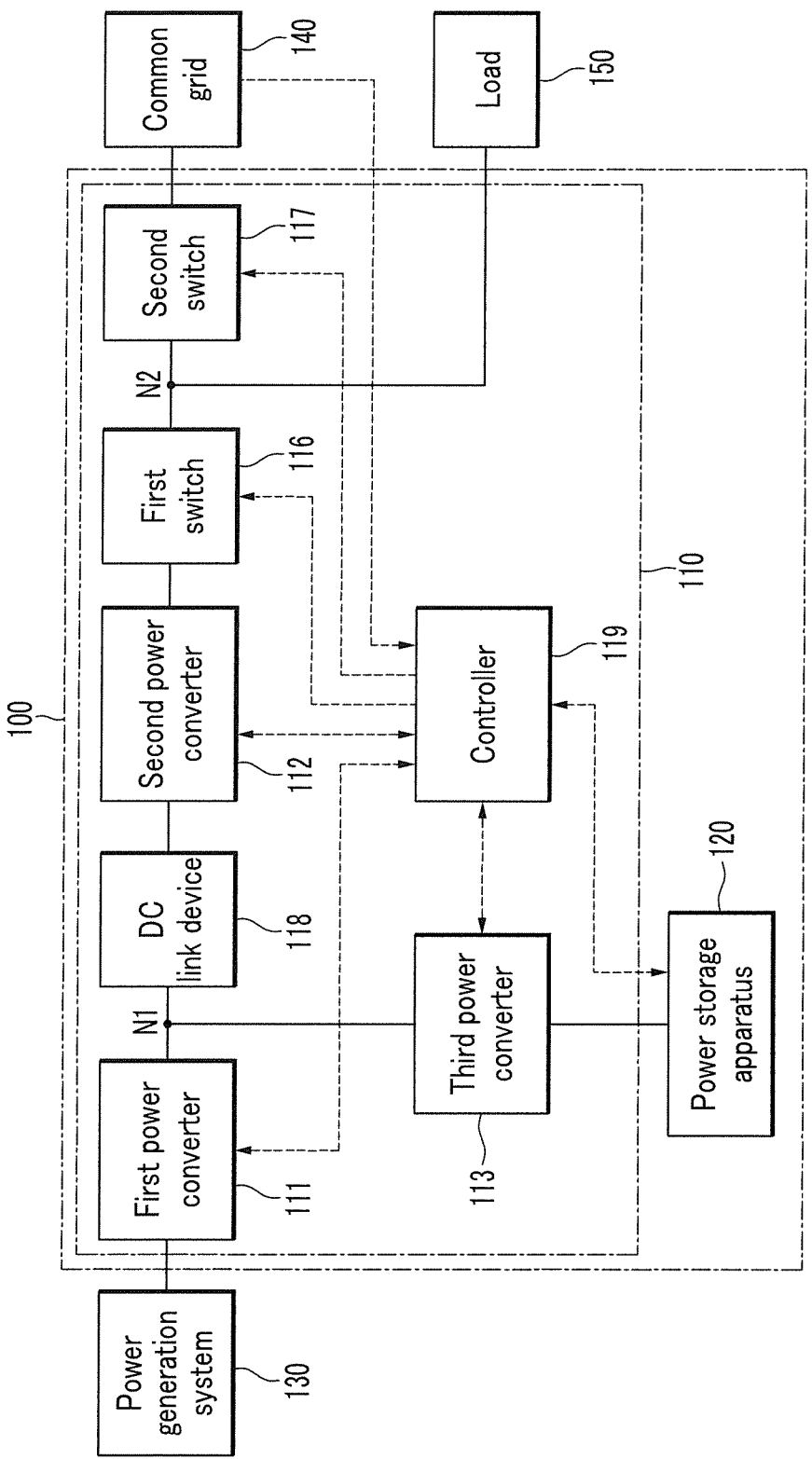
FIG. 1 is a block diagram of a grid-connected power storage system according to an exemplary embodiment of the present invention.

The embodiments of present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Further, in the exemplary embodiments, like reference numerals designate like elements throughout the specification representatively in a first exemplary embodiment and only elements other than those of the first exemplary embodiment will be described thereafter.

The drawings and description are to be regarded as illustrative in nature and not restrictive.

Throughout this specification and the claims that follow, when it is described that an element is "coupled" to another element, the element may be "directly coupled" to the other element or "electrically coupled" to the other element through one or more other elements. In addition, unless explicitly described to the contrary, the word "comprise" and variations such as "comprises" or "comprising", will be understood to imply the inclusion of stated elements, but not to imply the exclusion of any other elements.

FIG. 1 is a block diagram of a grid-connected power storage system according to an exemplary embodiment of the present invention.

Referring to FIG. 1, a grid-connected power storage system 100 includes a power management system 110 and a power storage apparatus 120.

The grid-connected power storage system 100 is electrically coupled with a power generation system 130, a common grid 140, and a load 150.

The power generation system 130 includes a system for generating renewable electric energy using sunlight, wind power, wave power, tidal power, or terrestrial heat. For example, a solar power generating system includes a solar cell module formed of a plurality of solar cells, which convert sunlight to electric energy, that are electrically coupled in series or in parallel.

The common grid 140 includes a power generation plant for generating power through, for example, steam power generation, water power generation, or nuclear power generation, and a substation that changes the electrical properties of voltage or current to transmit generated power through a power transmission line, a power distribution line, or a transmission station.

The load 150 represents various electric devices that consume power. For example, it may represent home electronics or factory equipment.

The power management system 110 is a system that electrically couples electric grids of power of the power generation system 130, power of the common grid 140, and power of the power storage apparatus 120. The power management system 110 can manage a time difference between production and consumption through power grids using the power storage apparatus 120.

The power storage apparatus 120 includes a rechargeable battery that can be repeatedly charged and discharged. The rechargeable battery may include any of a nickel-cadmium battery, a lead-acid battery, a nickel-metal hydride battery, a lithium ion battery, and a lithium polymer battery.

The power storage apparatus 120 includes a battery rack that includes a plurality of battery trays including a plurality of cells (e.g., battery cells) coupled in series or in parallel.

A controller (e.g., a battery management system (BMS)) that controls charging and discharging of the rechargeable battery may be included in the power storage apparatus 120 or the power management system 110. In further detail, the controller includes a rack controller (e.g., a rack BMS) for managing a plurality of tray controllers (e.g., tray BMSs) for respectively managing the plurality of battery trays and the battery rack.

The tray controller detects a voltage and a temperature of each cell included in the battery tray, measures a tray current to monitor a state of charge (SOC) and a state of health (SOH) of the battery tray, and performs cell balancing based on a measured voltage of each cell. With such management, efficiency of the battery tray can be improved. A tray current flows to the battery tray, and the plurality of battery trays forming the battery rack respectively have the same tray current.

The rack controller can synchronize the tray controllers by controlling operation of the tray controllers. In addition, when the rack controller controls each tray controller, measurement of a tray current does not need to be performed for each tray controller. The tray current measurement may be performed once according to control of the rack controller. The tray controller and/or rack controller can synchronize measurement of cell voltages and measurement of tray current, and can calculate a state of charge (SOC) using the measured cell voltages and the measured tray current. The SOC is a charging amount that indicates a discharging amount (%) that can be performed by the battery (e.g., the battery rack) with respect to a full charge capacity (FCC).

The power management system 110 includes a first power converter 111, a second power converter 112, a third power converter 113, a first switch 116, a second switch 117, a DC link device 118, and a control device (e.g., controller) 119.

The first power converter 111 is electrically coupled to the power generation system 130 and changes first power generated from the power generation system 130 to second power and transmits the second power to a first node N1. The first power generated from the power generation system 130 may be direct current (DC) power or alternating current (AC) power, and the second power of the first node N1 is DC power. That is, the first power converter 111 may convert the first power of DC into the second power having another magnitude, or may be a rectifier for converting the first power of AC power into the second power of DC.

The first power converter 111 performs Maximum Power Point Tracking (hereinafter referred to as "MPPT") control for maximizing power generated by the power generation system 130. That is, the first power converter 111 may be an MPPT converter having a maximum power point tracking function.

The DC link device 118 is electrically coupled to the first node N1, and maintains a voltage level of the first node N1 at a constant DC link voltage level. The DC link device 118 prevents the voltage level of the first node N1 from being unstable due to fluctuation of an output voltage of the power generation system 130, an instantaneous voltage drop, and maximum load occurrence of the load 150 for normal operation of the second and third power converters 112 and 113.

The DC link device 118 may be a DC link capacitor that is electrically coupled in parallel between the first node N1 and the second power converter 112. The DC link capacitor may include an electrolytic capacitor, a polymer capacitor, and a multi-layer ceramic capacitor.

The second power converter 112 is electrically coupled between the first node N1 and a second node N2, and the common grid 140 and the load 150 are electrically coupled to the second node N2. The second power converter 112 changes DC power of the first node N1 to AC power and transmits the AC power to the second node N2. In addition, the second power converter 112 changes the AC power of the second node N2 to DC power and transmits the DC power to the first node N1. That is, the second power converter 112 may perform as a bi-directional converter that converts the DC power of the first node N1 and the AC power of the second node N2 bi-directionally. In the second node N2, AC power supplied to the common grid 140 and the load 150 or AC power supplied from the common grid 140 are formed.

The third power converter 113 is electrically coupled between the first node N1 and the power storage apparatus 120. The third power converter 113 changes the second power of DC to third power of DC to be stored in the power storage apparatus 120, and then transmits the changed power to the power storage apparatus 120. Further, the third power converter 113 changes the third power of DC in the power storage apparatus 120 to the second power of DC and transmits the changed power to the first node N1. That is, the third power converter 113 can perform a function of a bi-directional converter that changes DC power of the first node N1 and DC power of the power storage apparatus 120 bi-directionally.

The first switch 116 is electrically coupled between the second power converter 112 and the second node N2, and blocks power flow between the second power converter 112 and the second node N2. The second switch 117 is electrically coupled between the common grid 140 and the second node N2, and blocks power flow between the common grid 140 and the second node N2. For the first switch 116 and the second switch 117, a field effect transistor (FET) or a bipolar junction transistor (BJT) may be used.

Particularly, the second switch 117 blocks power supply to the common grid 140 and realizes separate driving of the grid-connected power storage system 100 when the common grid 140 is in abnormal conditions. When the second switch 117 is turned off, the grid-connected power storage system 100 is separated from the common grid 140 such that it can be separately driven using power of the power generation system 130 and the power storage apparatus 120, and power output from the grid-connected power storage system 100 can prevent the common grid 140 from being driven in the abnormal conditions.

The control device 119 controls the entire operation of the power management system 110. The control device 119 receives information (i.e., sensing signals of voltage, current, and temperature) on power generated from the first power converter 111, receives power storage information including, for example, RSOC, SOC, and/or SOH from the power storage apparatus 120 (or controller, or BMS), and receives grid information including the voltage, current, and temperature of a grid.

The control device 119 controls a driving mode of the power management system 110 based on the power information generated from the power generation system 130, the power storage information of the power storage apparatus 120, and the grid information of the common grid 140.

The control device 119 receives sensing signals of the voltage, the current, and the temperature from the first power converter 111, the second power converter 112, and the third power converter 113, and controls power conversion efficiency of the respective power converters 111, 112, and 113 according to the driving mode of the power management system 110. The control device 119 controls the first and second switches 116 and 117 according to the driving mode of the power management system 110.

The driving mode power management system 110 may be classified according to a power supply method between at least two of the power storage apparatus 120, the power generation system 130, the common grid 140, or the load 150. The driving mode of the power management system 110 includes: (1) power supply from the power generation system 130 to the power storage apparatus 120; (2) power supply from the power generation system 130 to the common grid 140; (3) power supply from the power generation system 130 to the load 150; (4) power supply from the power storage apparatus 120 to the common grid 140; (5) power supply from the power storage apparatus 120 to the load 150; (6) power supply from the common grid 140 to the power storage apparatus 120; and (7) power supply from the common grid 140 to the load 150.

First, a method for the tray controller to synchronize measurement voltages of the plurality of cells and measurement of tray current and calculate a SOC using the measured cell voltage and tray current will be described.

Figure 2:
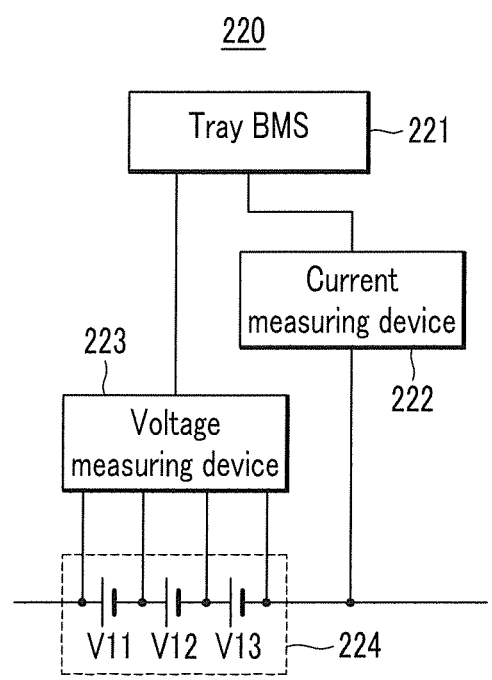
FIG. 2 is a block diagram of a power storage system according to the exemplary embodiment of the present invention shown in FIG. 1.

FIG. 2 is a block diagram of a power storage system according to the exemplary embodiment of the present invention.

Referring to FIG. 2, the power storage apparatus 120 may include a plurality of battery trays. One battery tray 220 among the plurality of battery trays will be described for convenience of description.

The battery tray 220 includes a tray controller (e.g., a tray BMS) 221, a current measuring device 222, a voltage measuring device 223, and a plurality of cells (e.g., battery cells) 224. In FIG. 2, three cells (e.g., V11, V12, and V13) are coupled in series in the battery tray 220, but the number of cells included in the battery tray is not limited thereto.

The tray controller 221 measures a cell voltage and a tray current of each of the plurality of cells 224 included in the battery tray 220, and manages charging and discharging of the battery tray 220.

The tray controller 221 can receive various cell voltage data (e.g., a plurality of cell voltage data) including, for example, a voltage value and a measurement time of one of the plurality of cells 224 from the voltage measuring device 223, and can receive tray current data including a current value and a measurement time output to, or input from, the battery tray 220 from the current measuring device 222.

The tray controller 221 calculates a SOC of the battery tray 220 using cell voltage and tray current data included in a measuring period during which the measurement time of the cell voltage data corresponds to the measurement time of the current time.

The current measuring device 222 is electrically coupled to the plurality of cells 224 coupled in series to measure the amount of input or output current of the plurality of cells 224.

The current measuring device 222 includes a real time clock (RTC) (not shown) for calculation of a measurement time of the current amount. The current measuring device 222 generates the tray current data including a current value of a current flowing to the plurality of cells 224 and a measurement time, and transmits the tray current data to the tray controller 221. The current measuring device 222 may periodically transmit the tray current data according to measuring period (e.g., a predetermined measuring period).

The voltage measuring device 223 is electrically coupled to each of the plurality of cells 224 coupled in series to measure a voltage of each of the plurality of cells 224. The voltage measuring device 223 uses a RTC for calculation of a measurement time of a voltage of each of the plurality of cells 224.

The voltage measuring device 223 generates cell voltage data including a voltage value of one of the plurality of cells 224 and a measurement time, and transmits the data to the tray controller 221.

The cell voltage data includes first cell voltage data including a voltage value and a measurement time of a first cell V11, second cell voltage data including a voltage value and a measurement time of a second cell V12, and third cell voltage data including a voltage value and a measurement time of a third cell V13.

That is, the voltage measuring device 223 can generate various cell voltage data corresponding to the plurality of cells 224, and can transmit the generated data to the tray controller 221. The voltage measuring device 223 can sequentially transmit the cell voltage data during the measuring period.

The tray controller 221 can generate a clock signal that controls a phase and a frequency of a RTC, and may periodically transmit the generated clock signal to the current measuring device 222 and the voltage measuring device 223 for maintaining synchronization of a RTC of the current measuring device 222 and a RTC of the voltage measuring device 223.

The current measuring device 222 and the voltage measuring device 223 maintain synchronization therebetween by matching their RTCs according to the received clock signal.

A process for calculating the SOC of the battery tray 220 will now be described.

Figure 3:
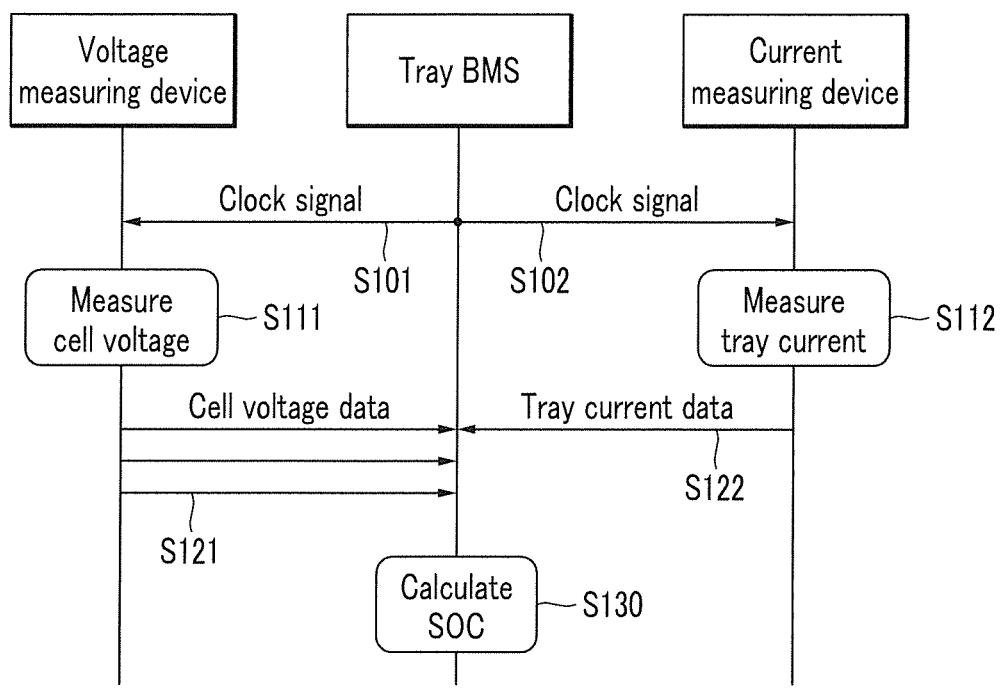
FIG. 3 is a flowchart of a SOC calculation process according to the exemplary embodiment of the present invention shown in FIG. 1.

FIG. 3 is a flowchart of a SOC calculation process according to the present embodiment.

Referring to FIGS. 2 and 3, the tray controller 221 may periodically transmit a clock signal to the voltage measuring device 223 and the current measuring device 222 for synchronization of the voltage measuring device 223 and the current measuring device 222 (S101 and S102). The voltage measuring device 223 and the current measuring device 222 can match synchronization therebetween by controlling their RTCs using the received clock signal.

The voltage measuring device 223 measures a voltage of each of the plurality of cells 224 included in the battery tray 220 (S111). In the present embodiment, the voltage measuring device 223 measures a measurement time of the cell voltage measurement of each of the plurality of cells 224 using the RTC. The voltage measuring device 223 generates cell voltage data of the plurality of cells 224. The cell voltage data includes a voltage value and a measurement time of one of the plurality of cells 224.

The current measuring device 222 measures an input or output tray current of the battery tray 220 (S112). In this case, the current measuring device 222 measures a measurement time at which the tray current is measured using the RTC. The current measuring device 222 generates tray current data including a current value and a measurement time of the tray current.

The voltage measuring device 223 sequentially transmits the cell voltage data to the tray controller 221 (S121).

The current measuring device 222 transmits the tray current data to the tray controller 221 (S122).

The tray controller 221 calculates the SOC of the battery tray 220 using the cell voltage data and the tray current data (S130). The SOC calculation process can be realized using various processors. For example, the tray controller 221 converts the cell voltages of the respective cells 224 into charging amounts (e.g., converts cell voltage data into data representing changing amounts), and calculates a SOC of the battery tray 220 by dividing the converted charging amounts with a FCC. Alternatively, the tray controller 221 converts the cell voltages of the plurality of cells 224 and calculates the SOC of the battery tray 220 by dividing the converted charging amount with the FCC. Alternatively, the tray controller 221 converts the tray current into the charging amount (e.g., converts the tray current data into data representing charging amount) by integrating the tray current, and calculates the SOC of the battery tray 220 by dividing the converted charging amount with the FCC.

Transmission of the cell voltage data is performed for a measuring period (e.g., a predetermined measuring period) during which the tray current data is transmitted. That is, the tray current data is transmitted once during the measuring period, but the various cell voltage data are respectively transmitted with a number of periods that corresponds to the number of cells included in the battery tray during the measuring period. Thus, a delay or an error may occur in the transmission of the cell voltage data as compared to transmission of the tray current data. Due to the transmission delay or transmission error of the cell voltage data, the cell voltage data and the tray current data cannot be synchronized with the same period of transmission, and the calculation of the RSOC of the battery tray 220 may be inaccurate.

Hereinafter, a method for synchronization of the cell voltage data and the tray current data by correcting the transmission delay or the transmission error of the cell voltage data in the tray controller 221 will be described.

Figure 4:
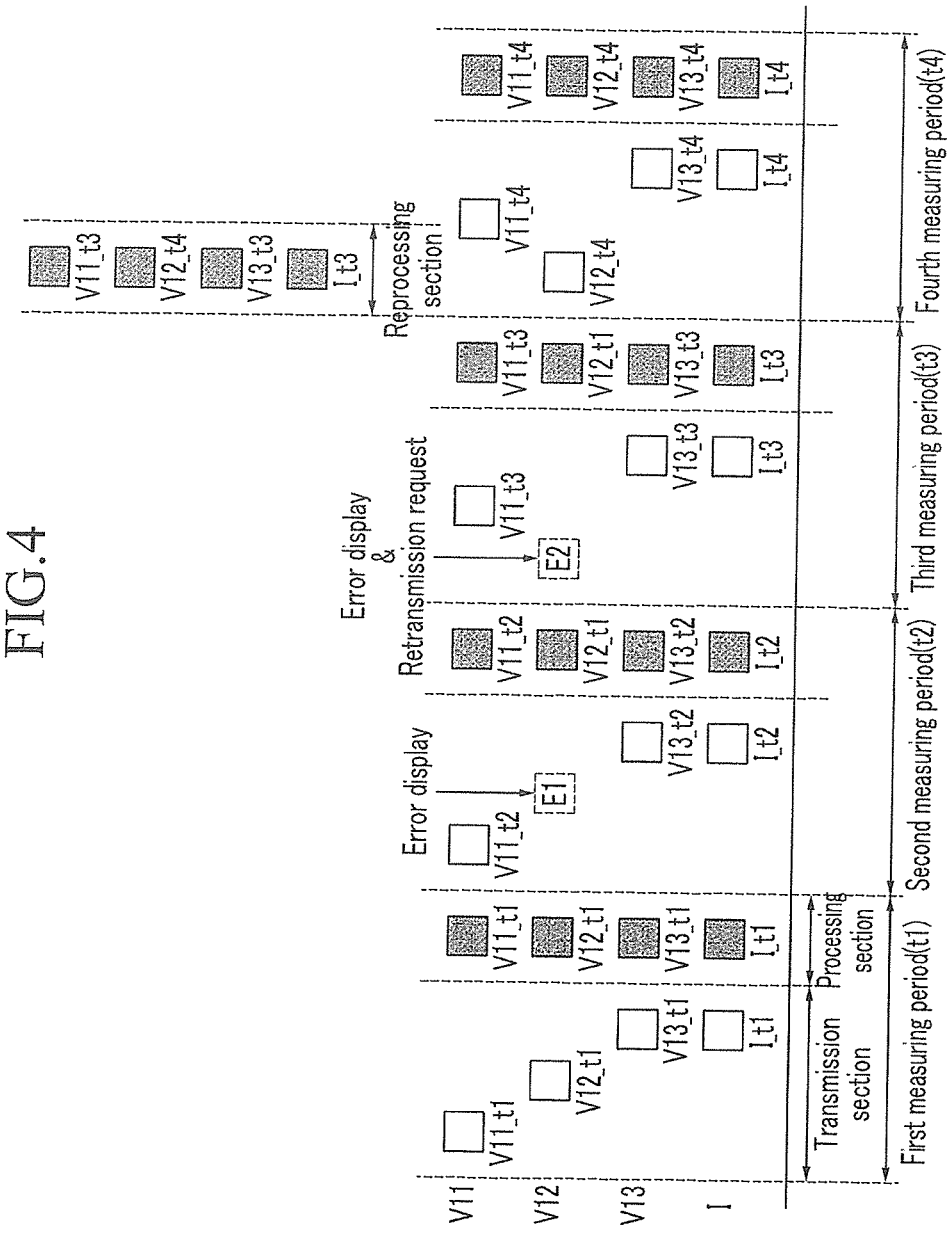
FIG. 4 is a timing diagram of a method for synchronization of a measured voltage and a measured current of a battery according to the exemplary embodiment of the present invention shown in FIG. 1.

FIG. 4 is a timing diagram of a synchronization method of the measured voltage and the measured current of the battery according to the present exemplary embodiment.

Referring to FIG. 4, the cell voltage data and the tray current data are measured during a measuring period (e.g., a predetermined measuring period). The measuring period is a period for accurate calculation of a SOC in an environment during which charging and discharging are iteratively performed within a short period time. The measuring period may be set to about 250 ms, for example, in one embodiment.

The measuring period may include a transmission section, or transmission period, during which the various cell voltage data and the tray current data are transmitted, and a processing section (e.g., processing period) during which the SOC is calculated. The tray controller stores cell voltage data and tray current data received during the processing section, and calculates the SOC. In addition, the voltage measuring device measures the plurality of cell voltages during the processing section, and the current measuring device measures a tray current during the processing section.

During the transmission section, the various cell voltage data is sequentially transmitted, and the tray current data is transmitted once. That is, the measuring period time matches the transmission period of the tray current data, and cell voltage data of the plurality of cells 224 included in the battery tray 220 may be transmitted during a period in which the tray current data is transmitted once.

The tray controller synchronizes a transmission period of the cell voltage data and a transmission period of the tray current data transmitted during the same measuring period. That is, the tray controller calculates the SOC of the battery tray 220 by ensuring that the cell voltage data and the tray current data transmitted during the same measuring period are concurrently (e.g., simultaneously) transmitted. The tray controller determines a measurement time in the cell voltage data to determine a measuring period including a measurement time of the corresponding cell voltage data. In addition, the tray controller can determine a measuring period including a measuring period of the corresponding tray current data by determining a measuring period in the tray current data. Thus, the tray controller can find cell voltage data included in a measuring period during which a measurement time of the cell voltage data corresponds to a measurement time of the tray current data among the various cell voltage data received from the voltage measuring device.

As shown in FIG. 4, during a transmission section, or transmission period, of a first measuring period t1, cell voltage data V11_t1, V12_t1, and V13_t1 of the plurality of cells V11, V12, and V13 are sequentially transmitted and tray current data I_t1 is transmitted. During a processing section of the first measuring period t1, the controller synchronizes transmission of the cell voltage data V11_t1, V12_t1, and V13_t1 and transmission of the tray current data I_t1 in the same period. The tray controller can calculate the SOC of the first measuring period t1 by using the cell voltage data V11_t1, V12_t1, and V13_t1 and the tray current data I_t1.

In a second measuring period t2, when a first transmission error E1 of cell voltage data of the second cell V12 occurs, the tray controller error-processes the cell voltage data having the transmission error E1, and replaces cell voltage data V12_t1 of the second cell V12 received in the first measuring period t1 with cell voltage data of the second cell V12 of a second measuring period t2. In this case, the tray controller may provide an error display for first transmission error E1. The error display may be provided to a user through a display device electrically coupled to the power storage apparatus 120 or the power management system 110.

That is, the tray controller error-processes the cell voltage data having a transmission error in the present measuring period, and replaces a voltage of the error-processed cell voltage data with a previous value received before the present measuring period.

The tray controller calculates a SOC of the second measuring period t2 using correctly (e.g., normally) received cell voltage data V11_t2, and t2, the replaced cell voltage data V12_t1, and tray current data I_t2.

In a third measuring period t3, the cell voltage data of the cell V12 having the transmission error E2 in the second measuring period t2 may be transmitted with priority.

That is, the various cell voltage data is sequentially transmitted during a measuring period, but cell voltage data including a voltage value of a cell corresponding to the cell voltage data having a transmission error in a previous measuring period (e.g., a measuring period preceding a present measuring period) may be transmitted with priority in the present measuring period.

When a second transmission error E2 of the cell voltage data of the cell V12 that experienced the transmission error E1 in the second measuring period t2 occurs in the third measuring period t3 (e.g., when a transmission error occurs in two consecutive measuring periods), the tray controller error-processes the cell voltage data having the second transmission error E2, and replaces the cell voltage data of the second cell V12 of the third measuring period t3 with the correctly received cell voltage data V12_t1 of the first measuring period t1. In this case, the tray controller provides an error display for the second transmission error E2 and requests re-transmission of the cell voltage data of the second cell V12 from the voltage measuring device.

That is, the tray controller requests re-transmission of cell voltage data having a transmission error from the voltage measuring device when voltage data of a cell corresponding to the cell voltage data experienced a transmission error in a previous measuring period of a present measuring period is error-processed.

In a fourth measuring period t4, when cell voltage data V12_t4 of the cell V12 that experienced the transmission error E2 in the third measuring period t3 is correctly received, the tray controller replaces a voltage value of the cell voltage data of the second cell V12 with the cell voltage data V12_t4 received in the fourth measuring period t4. The tray controller calculates a SOC of the third measuring period t3 using the cell voltage data V11_t3 and V13_t3 correctly received in the third measuring period t3, the replaced cell voltage data V12_t4, and the tray current data I_t3 in a re-processing section (e.g., reprocessing period) during which the cell voltage data V12_t4 of the second cell V12 is received with priority.

That is, the tray controller error-processes the cell voltage data having a transmission error in the present measuring period and replaces a voltage value of the error-processed cell voltage data with a voltage value of the next cell voltage data received after the present measuring period.

In other words, the tray controller replaces cell voltage data having a transmission error in the previous measuring period with cell voltage data transmitted with priority in the present measuring period. The tray controller calculates a SOC of the previous measuring period by replacing the cell voltage data having the transmission error in the previous measuring period with the cell voltage data of the present measuring period.

As described, the cell voltage data and the tray current data that are transmitted during a measuring period are synchronized to be transmitted during the same period, and cell voltage data having a transmission error is replaced with one of a value received in the previous measuring period and a value received in the next measuring period to supplement the transmission error of the cell voltage data, thereby calculating a further accurate SOC.

Figure 5:
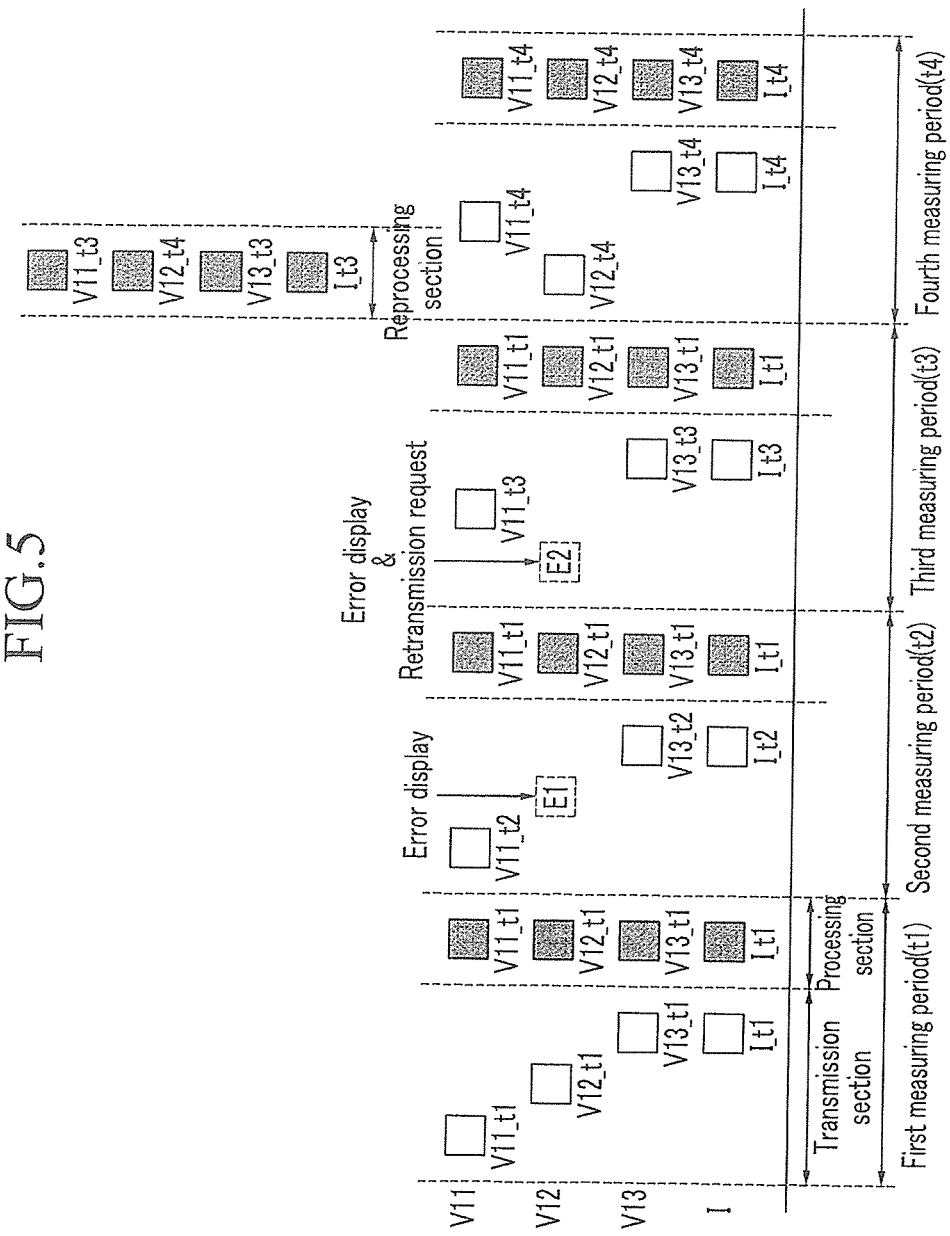
FIG. 5 is a timing diagram of a method for synchronization of a measured voltage and a measured current of a battery according to another exemplary embodiment of the present invention.

FIG. 5 is a timing diagram of a method for synchronization of a measured voltage and a measured current of a battery according to another exemplary embodiment of the present invention.

Referring to FIG. 5, a difference with FIG. 4 is that the tray controller error-processes the cell voltage data and tray current data transmitted during a present measuring period when cell voltage data, which corresponds to at least one of the plurality of cells V11, V12, and V13, received during the present measuring period experiences a transmission error. The tray controller replaces the error-processed cell voltage data with cell voltage data correctly received in the previous measuring period of the present measuring period. The tray controller replaces error-processed tray current data with tray current data correctly received in the previous period of the present measuring period.

As shown in FIG. 5, when a first transmission error E1 of cell voltage data of a second cell V12 occurs in a second measuring period t2, the tray controller error-processes cell voltage data V11_t2, E1, and V13_t2 received during the second measuring period t2 and replaces the error-processed data with cell voltage data V11_t1, V12_µl, and V13_t1 that is correctly received in a first measuring period t1. In addition, the tray controller error-processes tray current data I_t2 transmitted during the second measuring period t2, and replaces the error-processed data with tray current data I_t1 correctly received in the first measuring period t1.

That is, the tray controller calculates a SOC of the second measuring period t2 during which the transmission error E1 occurred by using the cell voltage data and the tray current data I_t1 that are correctly received in the first measuring period t1.

In addition, when a second transmission error E2 of cell voltage data of a second cell V12 occurs in a third measuring period t3, the tray controller calculates a SOC of the third measuring period t1 using the cell voltage data and the tray current data I_µl that are correctly received in the first measuring period t1.

In the fourth measuring period t4, when cell voltage data V12_t4 of the cell V12 that experienced the second transmission error E2 in the fourth measuring period t4 is correctly received, the tray controller replaces a voltage value of the cell voltage data of the second cell V12 of the third measuring period t3 with the cell voltage data V12_t4 correctly received in the fourth measuring period t4. In addition, the tray controller calculates a SOC of the fourth measuring period t4 using the cell voltage data V11_t3 and V13_t3 and the tray current data I_t3 that are correctly received in the third measuring period t3 as well as the replaced cell voltage data V12_t4.

In FIG. 4 and FIG. 5, the tray current data is transmitted at a time point when the last cell voltage data is transmitted during the transmission section, but it is not limited thereto. The tray current data may be transmitted at a time point at which the first cell voltage data is transmitted during the transmission section, or may be transmitted at a time point that is not overlapped with a time point at which the cell voltage data is transmitted.

Next, a method for the rack controller to synchronize voltage measurement and rack current measurement of the plurality of battery trays and calculate a SOC using the measured tray voltage and the measured rack current will now be described.

Figure 6:
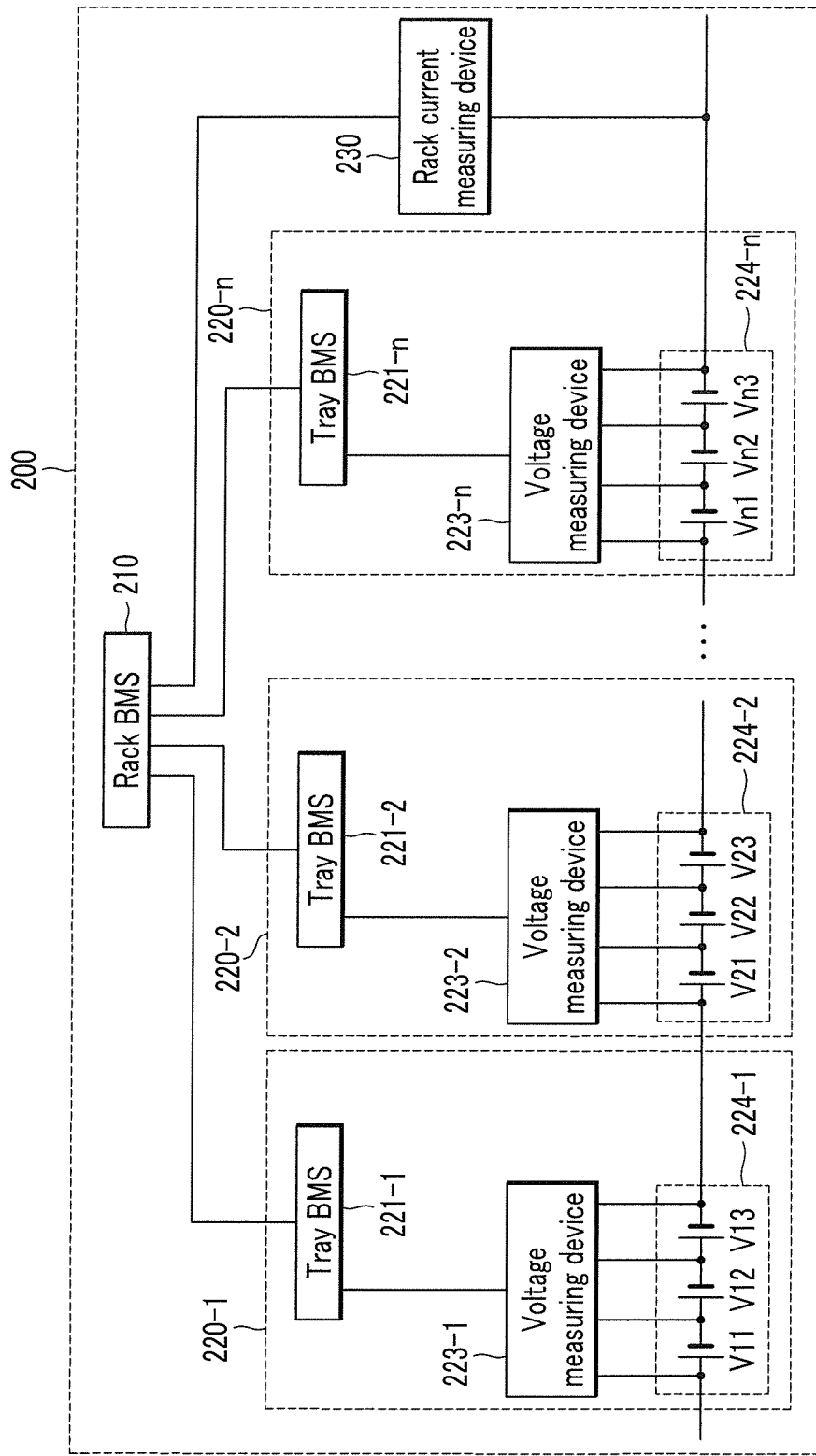
FIG. 6 is a block diagram of a power storage system according to the exemplary embodiment of the present invention shown in FIG. 5.

FIG. 6 is a block diagram of a power storage system according to the exemplary embodiment of the present invention depicted in FIG. 5.

Referring to FIG. 6, a power storage apparatus 120 includes at least one battery rack 200. The battery rack 200 includes a rack controller 210 and a plurality of battery trays 220-1, 220-2, ... , and 220-n. The plurality of battery trays 220-1, 220-2, ... , and 220-n respectively include tray controllers 221-1, 221-2, ... , and 221-n, voltage measuring devices 223-1, 223-2, ... , and 223-n, and a plurality of cells 224-1, 224-2, ... , and 224-n.

The rack controller 210 manages charging and discharging of the plurality of battery trays 220-1, 220-2, ... , and 220-n. The rack controller 210 receives tray voltage data including a voltage value and a measurement time of each battery tray from each of the plurality of tray controllers 221-1, 221-2, ... , and 221-n. The rack controller 210 receives rack current data including an output or input current value of the battery rack 220, and receives a measurement time from a rack current measuring device 230. The rack controller 210 can calculate a SOC of the battery rack 200 using tray voltage data and rack current data included in a measuring period during which the measurement time of the tray voltage data corresponds to the measurement time of the rack current data.

The rack current measuring device 230 is electrically coupled to the battery rack 200 to measure an output or input current of the battery rack 200. The rack current measuring device 230 uses a RTC for calculation of a measurement time of the current amount. The rack current measuring device 230 generates rack current data including a current value of a current flowing in the plurality of cells 224 included in the battery rack 200 and a measurement time, and transmits the rack current data to the rack controller 210. The rack current measuring device 230 may periodically transmit the rack current data according to a measuring period (e.g., a predetermined measuring period).

Each of the plurality of tray controllers 221-1, 221-2, ..., and 221-n measures a tray voltage thereof. Each of the plurality of tray controllers 221-1, 221-2, ..., and 221-n uses a RTC for calculation of a measurement time of a tray voltage. Each of the plurality of tray controllers 221-1, 221-2, ..., and 221-n generates tray voltage data including a tray voltage and a measurement time, and transmits the tray voltage data to the rack controller 210. Each of the plurality of tray controllers 221-1, 221-2, ..., and 221-n sequentially transmits tray voltage data.

To maintain synchronization between the plurality of tray controllers 221-1, 221-2, ..., and 221-n and the rack current measuring device 230, the rack controller 210 generates a clock signal that controls a phase and a frequency of the RTC, and may periodically transmit the clock signal to the plurality of tray controllers 221-1, 221-2, ..., and 221-n and the rack current measuring device 230.

The plurality of tray controllers 221-1, 221-2, ..., and 221-n and the rack current measuring device 230 maintain the synchronization therebetween by matching their RTCs according to the received clock signal.

A SOC calculation process of the battery rack 200 will now be described.

Figure 7:
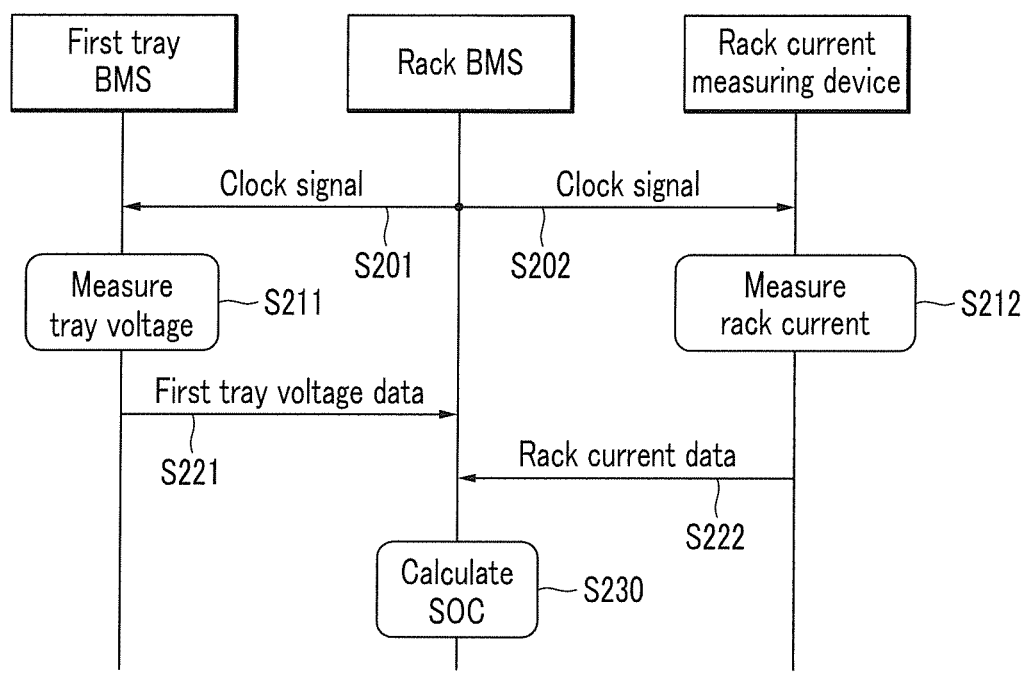
FIG. 7 is a flowchart of a SOC calculation process according to the exemplary embodiment of the present invention shown in FIG. 5.

FIG. 7 is a flowchart of a SOC calculation process according to the present embodiment.

Referring to FIGS. 6 and 7, the first tray controller 221-1 among N tray controllers and the rack current measuring device 230 will be illustrated for convenience of description. Operations of the second tray controller 221-2 to the N-th tray controller 221-n are the same as that of the first tray controller 221-1. However, N tray controllers sequentially transmit tray voltage data thereof.

The rack controller 210 may be provided with a RTC, and may periodically transmit a clock signal to the plurality of tray controllers 221-1, 221-2, ..., and 221-n and the rack current measuring device 230 for maintaining synchronization of the plurality of tray controllers (S201 and S202). The plurality of tray controllers 221-1, 221-2, ..., and 221-n and the rack current measuring device 230 can match synchronization therebetween by using the received clock signal.

The first tray controller 221-1 measures a tray voltage of the first battery tray 220-1 (S211). The tray voltage of the first battery tray 220-1 may be a voltage of all of the cells 224-1 included in the first battery tray 220-1. The first tray controller 221-1 measures a time at which the tray voltage is measured using the RTC. The first tray controller 221-1 generates first tray voltage data including the tray voltage and the measurement time.

The rack current measuring device 230 measures a rack current (S212). The rack current is an output or input current of the battery rack 200. The rack current measuring device 230 measures a time at which the rack current is measured using the RTC. The rack current measuring device 230 generates rack current data including a current value of the rack current and the measurement time.

The first tray controller 221-1 transmits the first tray voltage data to the rack controller 210 (S221). Tray voltage data generated from the first tray controller 221-1 to the N-th tray controller 221-n are sequentially transmitted to the rack controller 210.

The rack current measuring device 230 transmits the rack current data to the rack controller 210 (S222).

The rack controller 210 calculates the SOC of the battery rack 200 using the various tray voltage data (e.g., the plurality of tray voltage data) and the rack current data (S230).

Transmission of the various tray voltage data is performed for a measuring period (e.g., a predetermined measuring period) during which the rack current data is transmitted. That is, the rack current data is transmitted once during the measuring period, but the tray voltage data is transmitted for a number of times that corresponds to the number of battery trays included in the battery rack 200 during the measuring period.

The method for the tray controller to synchronize the plurality of cell voltage data and the tray current data has been described with reference to FIGS. 4 and 5. With the same method, the rack controller 210 synchronizes the tray voltage data and the rack current data. That is, the cell voltage data of FIG. 4 and FIG. 5 corresponds to the tray voltage data transmitted from the plurality of tray controllers 221-1, 221-2, ..., and 221-n. In addition, the tray current data of FIG. 4 and FIG. 5 corresponds to the rack current data. Thus, the rack controller 210 synchronizes the plurality of tray voltage data and the rack current data and calculates the SOC using the method of FIG. 4 and FIG. 5.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Therefore, it will be appreciated to those skilled in the art that various modifications are made and other equivalent embodiments are available. Accordingly, the actual scope of the present invention must be determined by the spirit of the appended claims, and equivalents thereof.

DESCRIPTION OF SOME OF THE REFERENCE CHARACTERS

| | |
|---|---|
| 100: grid-connected power storage system | 110: power management system |
| 120: power storage system | 130: power generation system |
| 140: common grid | 150: load |
| 200: battery rack | 210: rack controller (or rack BMS) |
| 220: battery tray | 221: tray controller (or tray BMS) |
| 222: current measuring device | 223: voltage measuring device |

What is claimed is:

1. A controller of a power storage system, the controller comprising:

a voltage measuring device configured to be electrically coupled to at least one cell and to generate first voltage data, the first voltage data comprising a first voltage value and a first voltage measurement time of a voltage of the at least one cell; and a current measuring device configured to be electrically coupled to the at least one cell and to generate first current data, the first current data comprising a first current value and a first current measurement time of a current through the at least one cell, the first voltage measurement time corresponding to the first current measurement time in a first measuring period, a battery management system configured to generate a clock signal transmitted to the voltage measuring device and the current measuring device to synchronize the first voltage data and the first current data in a first transmission period of the first measuring period.

2. The controller of claim 1, wherein the voltage measuring device is configured to transmit the first voltage data in a number of first voltage data transmission periods corresponding to a number of cells of the at least one cell during the first transmission period in the first measuring period, each of the first voltage data transmission periods corresponding to the first voltage measurement time of the first voltage data, and wherein the current measuring device is configured to transmit the first current data in a first current data transmission period during the first transmission period in the first measuring period, the first current data transmission period corresponding to the first current measurement time of the first current data.

3. The controller of claim 1, wherein the first measuring period further comprises a first processing period for calculating a first state of charge using the first voltage data and the first current data.

4. The controller of claim 3, wherein the voltage measuring device is further configured to generate second voltage data comprising a second voltage value and a second voltage measurement time of the voltage of the at least one cell during a second measuring period, wherein the current measuring device is further configured to generate second current data comprising a second current value and a second current measurement time of the current through the at least one cell during the second measuring period, and wherein the controller is configured to calculate a second SOC using the second current data, the first voltage data corresponding to one or more cells of the at least one cell, and the second voltage data corresponding to other cells of the at least one cell, when the second voltage data corresponding to the one or more cells of the at least one cell is erroneous.

5. The controller of claim 4, wherein the controller further comprises a display device configured to display an error message when the second voltage data is erroneous.

6. The controller of claim 5, wherein the controller is configured to send a retransmission request to the voltage measuring device when the second voltage data is repeatedly erroneous.

7. The controller of claim 4, wherein the controller is further configured to re-calculate the second SOC using the second current data, third voltage data corresponding to the one or more cells of the at least one cell generated during a third measuring period following the second measuring period, and the second voltage data corresponding to the other cells of the at least one cell, when the second voltage data corresponding to the one or more cells of the at least one cell is erroneous.

8. The controller of claim 3, wherein the voltage measuring device is further configured to generate second voltage data comprising a second voltage value and a second voltage measurement time of the voltage of the at least one cell during a second measuring period, wherein the current measuring device is further configured to generate second current data comprising a second current value and a second current measurement time of the current through the at least one cell during the second measuring period, and wherein the controller is configured to calculate a second SOC using the first current data and the first voltage data corresponding to the at least one cell, when the second voltage data corresponding to one or more cells of the at least one cell is erroneous.

9. The controller of claim 8, wherein the controller further comprises a display device configured to display an error message when the second voltage data is erroneous.

10. The controller of claim 9, wherein the controller is configured to send a retransmission request to the voltage measuring device.

11. The controller of claim 8, wherein the controller is further configured to re-calculate the second SOC using the second current data, third voltage data corresponding to the one or more cells of the at least one cell generated during a third measuring period following the second measuring period, and the second voltage data corresponding to other cells of the at least one cell.

12. A power storage apparatus comprising a battery rack, the battery rack comprising:

a rack controller configured to generate a clock signal to synchronize voltage data and current data of at least one cell;

a current measuring device configured to measure a current through the at least one cell to determine a current value of the current data;

a plurality of battery trays, each of the battery trays comprising:

a voltage measuring device configured to be electrically coupled to one or more cells on a corresponding one of the battery trays from among cells of the at least one cell;

a tray controller configured to be managed by the rack controller, and configured to:

receive the voltage data from the voltage measuring device, the voltage data comprising at least one of a voltage value, a temperature value, or a measurement time of the one or more cells on the corresponding one of the battery trays; and transmit the voltage data to the rack controller, wherein the rack controller is configured to:

synchronize the voltage data with the current data; and calculate a rack state of charge using the voltage data and the current data.

13. A method of operating a controller configured to calculate a state of charge using voltage data and current data of at least one cell, wherein, when the voltage data of one or more cells of the at least one cell is erroneous in a present measuring period, the method comprising:

calculating a present state of charge using most recently correct voltage data of the one or more cells of the at least one cell, and using either:

correct present measuring period voltage data of other cells of the at least one cell and correct present measuring period current data, or correct previous measuring period voltage data of the other cells of the at least one cell and correct previous measuring period current data.

14. The method of claim 13, wherein, when the voltage data of the one or more cells of the at least one cell is erroneous in a present measuring period, the method further comprising:

displaying an error message;

transmitting a retransmission request to request subsequent measuring period voltage data of the one or more cells of the at least one cell have priority over subsequent voltage data of the other cells of the at least one cell in a subsequent measuring period; and transmitting the subsequent voltage data of the one or more cells of the at least one cell in the subsequent measuring period with priority over the subsequent voltage data of the other cells of the at least one cell.

15. The method of claim 13, wherein, when subsequent voltage data of the one or more cells of the at least one cell is correctly transmitted, the method further comprising:

calculating a first subsequent state of charge in a subsequent measuring period using the present measuring period voltage data of the other cells of the at least one cell and subsequent measuring period voltage data of the one or more cells of the at least one cell during a reprocessing period in the subsequent measuring period; and calculating a second subsequent state of charge in the subsequent measuring period using the subsequent measuring period voltage data of the other cells of the at least one cell and the subsequent measuring period voltage data of the one or more cells of the at least one cell during a processing period in the subsequent measuring period following the reprocessing period.

\* \* \* \* \*